United States Patent [19]

Scheffels et al.

[11] 4,317,983

[45] Mar. 2, 1982

[54] SETTING THE ELECTRON GUN CATHODE HEATING CURRENT OF AN ELECTRON BEAM MACHINE

[75] Inventors: Wilhelm Scheffels, Puchheim; Ruprecht Hoffmann, Oberschweinbach, both of Fed. Rep. of Germany

[73] Assignee: Steigerwald Strahltechnik GmbH, Puchheim, Fed. Rep. of Germany

[21] Appl. No.: 83,384

[22] Filed: Oct. 10, 1979

[30] Foreign Application Priority Data

Oct. 10, 1978 [DE]  Fed. Rep. of Germany ....... 2844183

[51] Int. Cl.³ ............... H05B 39/04; H05B 41/36; B23K 15/00
[52] U.S. Cl. ............... 219/121 EA; 219/121 EM; 315/106
[58] Field of Search ........... 219/121 EA, 121 EB, 219/121 EM; 315/106, 107

[56] References Cited

U.S. PATENT DOCUMENTS

| | | | |
|---|---|---|---|
| 3,413,517 | 11/1968 | Barber et al. | 315/107 X |
| 3,699,381 | 10/1972 | Kondo et al. | 315/107 X |
| 3,760,279 | 9/1973 | Rudolph | 219/121 EA X |
| 3,838,313 | 9/1974 | Anderson | 219/121 EA X |
| 3,875,366 | 4/1975 | Von Walter | 219/121 EA |
| 4,021,636 | 5/1977 | Von Walter | 219/121 EA |

OTHER PUBLICATIONS

*Avt. Svarka.*, 1969, No. 2 pp. 51–55, "A New 13.5 kw Electron Beam Welding Apparatus" by O. K. Nazarenko et al.

*Primary Examiner*—Gene Z. Rubinson
*Assistant Examiner*—Keith E. George
*Attorney, Agent, or Firm*—Brumbaugh, Graves, Donohue & Raymond

[57] ABSTRACT

In an electron beam machine for e.g. beam welding, the beam current $I_{em}$ is stabilized by negative feedback applied to the grid of the electron gun. The optimum cathode heating current is ascertained by causing the cathode heating current $I_H$ to decrease steadily from a maximum value. The beam current is kept constant by the feedback, which adjusts the grid voltage $U_W$ to offset the decrease in cathode temperature caused by the decreasing heating current; the rate of change of the grid voltage $U_W$ is monitored, and when this rate of change exceeds a threshold, the decrease in heating current is arrested, and the heating current is maintained at the thus established optimal value or preferably set at a slightly higher value, which secures an extended length of life of the cathode. This setting of the cathode heating current is repeated after a predetermined interval of time to establish a new value in response to a change of the condition of the cathode.

11 Claims, 4 Drawing Figures

SETTING THE ELECTRON GUN CATHODE HEATING CURRENT OF AN ELECTRON BEAM MACHINE

The present invention relates to electron beam machines. More specifically, the invention relates to methods and circuits for setting the cathode heating current of an electron gun of an E. B. machine. Electron beam machines, as they are generally known, are devices which use the kinetic energy of an electron beam to work a material. U.S. Pat. No. 2,793,281, issued May 21, 1957 to K. H. Steigerwald, discloses such a machine. Such machines can be used for e.g. welding, cutting, melting, milling, and other working of materials.

BACKGROUND OF THE INVENTION

The cathode of the electron gun of an E. B machine is usually a tungsten wire or band cathode, heated directly by passing a heating current through it, the operating temperature of the cathode being a direct function of this heating current. Indirectly heated cathodes are also known and used; one suitble form of indirect heating is to direct at the cathode a heating electron beam, in which case the beam current of the heating beam can be adjusted to vary the cathode temperature. In any case, the temperature of the cathode can be varied by varying a "heating current" of some kind.

The useful operational life of the cathode is largely dependent upon the level of the vacuum in the electron gun and upon its operating temperature, and is shorter the higher the pressure and operating temperature are. The optimum temperature of a cathode for obtaining an extended operational life-time is near the lower limit of the socalled space charge region, i.e. the temperature at which the cathode emits somewhat more electrons than can be withdrawn by the accelerating field of the gun, and a negative space charge just begins to build up before the surface of the cathode. Below this temperature the cathode operates in the so-called saturation region, in which all of the emitted electrons are withdrawn by the accelerating field of the gun.

It is known to determine the optimum operating temperature of the cathode by measuring the heating current/emission current characteristic curve which has a bend at the transition from the saturation region to the space charge region (this will be discussed in greater detail with reference to FIG. 1). By repeating this process of establishing the optimum operation temperature of the cathode after some interval of time, the heating current will be set to successively lower values according to the burning down of the cathode as a result of evaporation and atomisation.

Because the vacuum in the region of the cathode is not normally constant, the heating cannot be reset depending upon the time of operation. A direct measurement of the cathode temperature would be difficult and costly.

In order to obtain reproducible results, electron beam machines usually operate with stabilised voltage and stabilised beam current. In a known process for setting the cathode heating current on the basis of the characteristic curve of the cathode heating current/cathode emission current the beam current regulation is disabled and the electron gun is operated at a constant Wehnelt voltage. The cathode heating current is varied in a particular range and the corresponding change of the emission or beam current is registered. Since the beam current changes during this process, the process cannot be carried out during a working operation, e.g. a welding operation. In order to avoid damage to the workpiece or its support a massive beam collector must be introduced into a path of the beam during measurement of the cathode characteristic curve.

THE INVENTION

An object of the present invention is to provide a process for setting the beam current which is simpler than the known process and can be carried out during an operation.

In the method according to the invention a cathode heating current/Wehnelt voltage characteristic curve is measured with the beam current regulation in operation. Since the beam current does not alter during the measurement it is possible to determine and set the optimum heating current during a working operation and no deactivation of the regulation and no beam collector in the path of the beam is necessary.

According to one aspect to the present invention, in a method of setting the cathode heating current of an electron gun of an electron beam machine, the electron beam current is stabilised by feedback acting to vary the grid-to-cathode voltage, the heating current is varied within a range, the variations in grid-to-cathode voltage are monitored during such variations of the heating current, and the cathode heating current is set at a value related in a predetermined manner to a portion of the curve relating grid-to-cathode voltage to heating current having predetermined characteristics.

According to another aspect of the present invention, a circuit for setting the cathode heating current of an electron gun of an electron beam machine tool comprises means arranged to sense the electron beam current, and, in dependence on the sensed beam current, to provide a grid-to-cathode voltage for the electron gun, which voltage varies in such a way as to provide feedback stabilisation of the beam current, means arranged to provide a heating current for a cathode of the electron gun, which heating current is varied within a range when the cathode heating current is to be set, and means arranged to monitor the variations in the grid-to-cathode voltage during such variations of the cathode heating current, and to set the cathode heating current at a value related in a predetermined manner to a portion of the curve relating grid-to-cathode voltage to cathode heating current having predetermined characteristics.

SHORT DESCRIPTION OF THE DRAWINGS

The invention may be carried into practice in various ways, but one specific embodiment will now be described by way of example, with reference to the accompanying drawings, of which:

Figure 1:
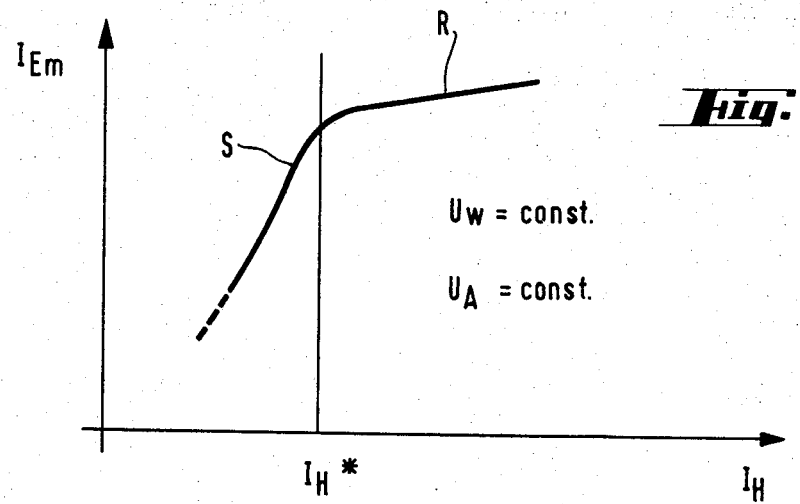
FIG. 1 is a graph showing the variation of beam current with cathode heating current for an electron gun which is operated with constant grid and anode voltages (measured relative to the cathode voltage)

Referring to FIG. 1, when the heating current $I_H$ of a directly heated tungsten cathode (10) (FIG. 3) of an electron gun is increased at constant voltages $U_W$ and $U_A$ relative to the cathode on a control or Wehnelt electrode 12 and an anode 14, respectively, from a low value, the emission current $I_{Em}$ of the cathode at first increases relatively sharply with the increasing heating current, as shown by the part marked S of the cathode heating current/cathode emission current characteristic curve. All electrons emitted by the cathoe are withdrawn by the anode field, so that the cathoe operates at saturation as regards the emission current. From a particular heating current $I_H^*$ more electrons are emitted than are withdrawn by the anode field and thus a space charge builds up before the cathode. The space charge part R of the characteristic curve is flatter than the saturation part S and the curve has a more or less sharp bend between these two parts.

A heating current, which is a few percent, say 2 to 3% higher than the current $I_H^*$ at the bend in the characteristic curve represents the optimum heating current since here the cathode operates safely in the space charge region with the lowest heating current, i.e. with the lowest cathode temperature.

As mentioned above, the known process for determined the optimum heating current has the disadvantage that the beam current alters so that the process cannot be carried out during operation of the E. B. machine.

Figure 2:
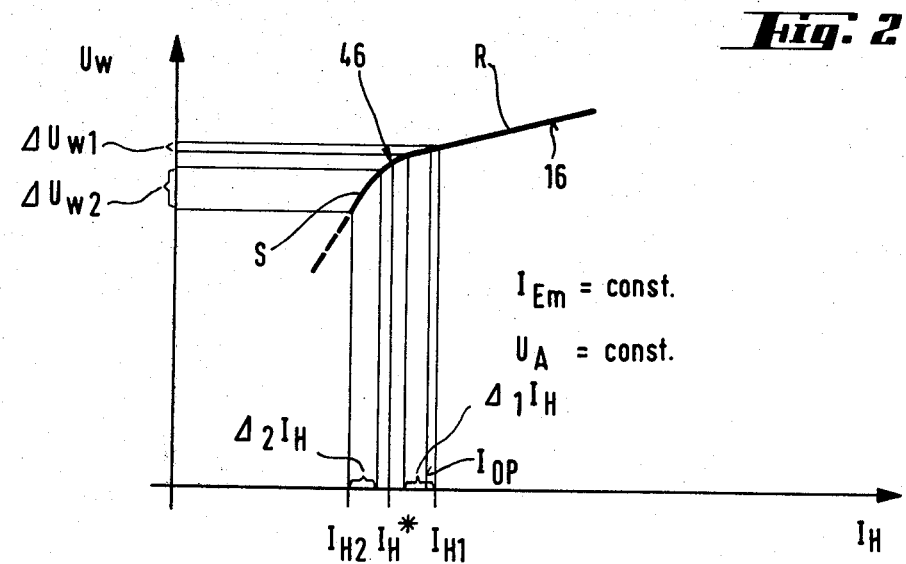
FIG. 2 is a graph showing the manner in which the grid voltage of an electron gun has to be varied with changes in cathode heating current in order to maintain the beam current constant.

According to the present invention an optimum heating current $I_{op}$ is obtained on the basis of the cathode heating current/Wehnelt voltage characteristic curve 16 which is shown in FIG. 2. The characteristic curve 16 has a similar shape to that of the cathode heating current/cathode emission current shown in FIG. 1, since the negative Wehnelt voltage with constant emission or beam current must be higher the more the cathode emits. The optimum heating current again is slightly above the bend in the characteristic curve 16.

DESCRIPTION OF A PREFERRED EMBODIMENT

Figure 3:
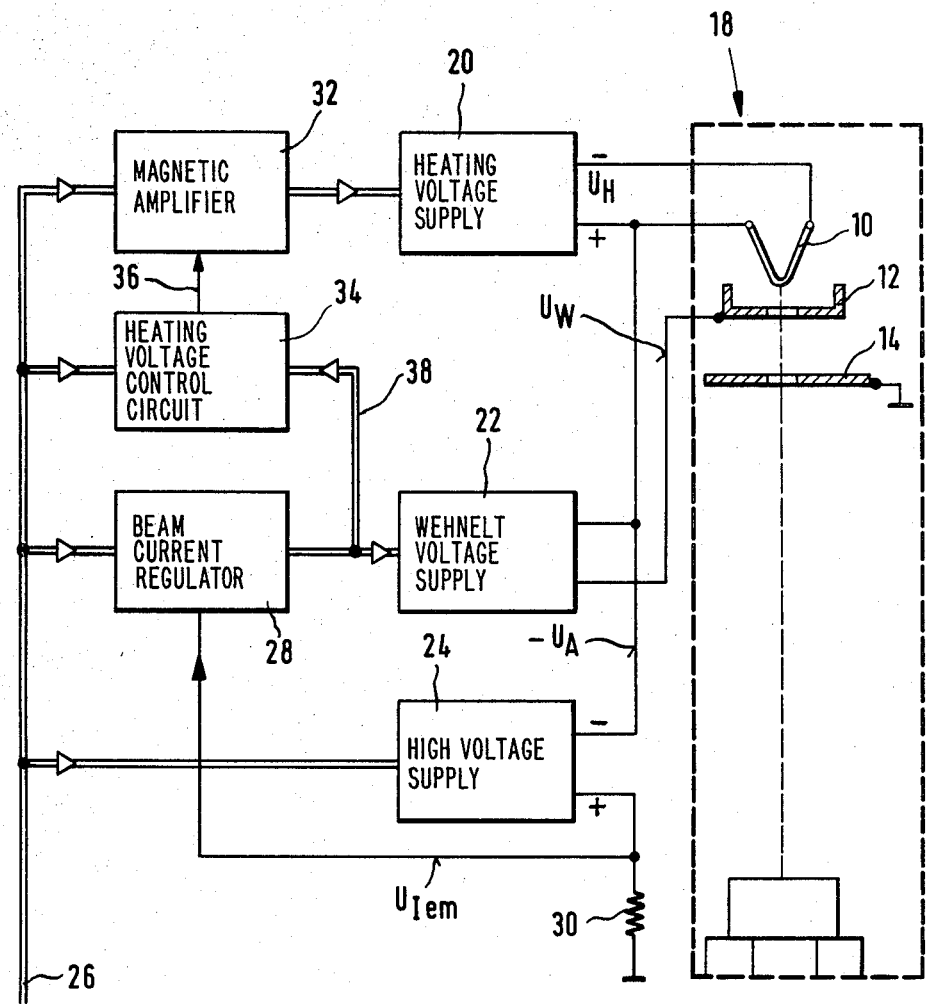
FIG. 3 is a diagram, largely in block form, of part of an electron beam machine and a preferred control circuit, embodying the invention, for the electron gun thereof.
Figure 4:
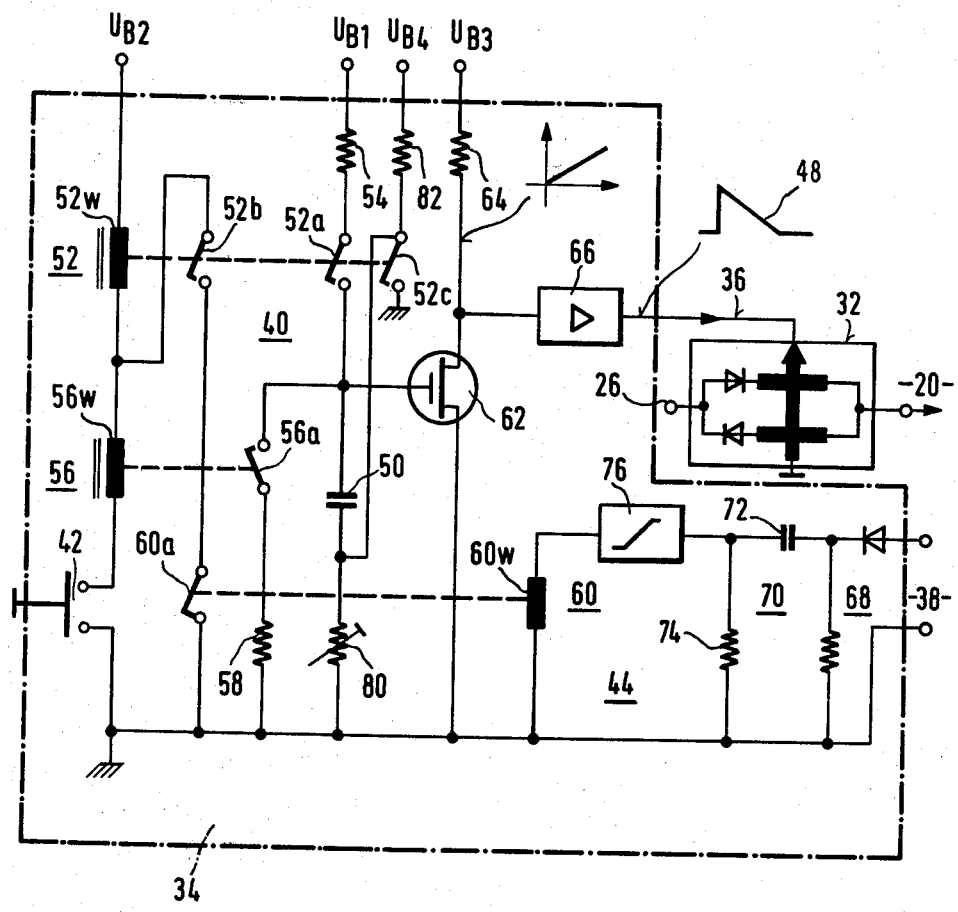
FIG. 4 is a more detailed circuit diagram of part of the electron gun control circuit of FIG. 3.

FIGS. 3 and 4 show in diagrammatic form an electron beam machine including an embodiment of the invention. Only the three electrodes 10, 12 and 14 which have already been mentioned of the electrode gun of an electron beam machine tool are shown in detail; the gun can be constructed in a known manner.

Power is supplied to the cathode 10 by a heating voltage supply 20 containing an isolating transformer with high voltage isolation between the primary and secondary sides and a rectifier and smoothing or filter circuit on the secondary side, in order to supply the cathode 10 with a direct heating voltage $U_H$.

The Wehnelt voltage $U_W$ for the Wehnelt or control electrode 12 is generated by a Wehnelt voltage supply 22. The high or accelerating voltage between the cathode 10 and the anode 14 is generated by a high voltage supply 24. The Wehnelt voltage supply 22 and the high voltge unit 24 can be constructed in principle like the heating voltage unit described above.

In the present case it should be assumed for the sake of simplicity that power is supplied to the circuit arrangement shown in FIG. 3 by a stabilised alternating current voltage from a lead 26. A.C. leads are shown in FIG. 3 by a double line. A beam current regulator 28 is connected between the A.C. lead 26 and the Wehnelt voltage supply 22. An emission current-actual value voltage $U_{Iem}$, which is generated by a current sensing resistor 30 connected between the positive output terminal of the high voltage supply 24 and ground, is supplied to the beam current regulator 28. The beam current regulator 28 can contain a transductor (magnetic amplifier) which supplies the Wehnelt voltage supply 22 with an A.C. current which increases the higher the emission current-actual value voltge $U_{Iem}$ is.

The device as described thus far is known in principle.

According to the invention, a transductor (i.e. a magnetic amplifier) 32 and a heating voltage control circuit 34, which is shown in greater detail in FIG. 4, are provided for setting the optimum heating current. The transductor 32 is connected between the A.C. lead 26 and the A.C. input of the heating voltage supply 20 and makes it possible to control the heating current by means of a control signal transmitted to it from the heating voltage control circuit 34 via a lead 36. The output A.C. voltage of the beam current regulator 28, which is proportional to the Wehnelt voltage $U_W$, is supplied as an input signal to the heating voltage control circuit 34 via a lead 38.

The heating voltage control circuit 34 and the transducer 32 are shown in greater detail in FIG. 4. The heating voltage control circuit 34 contains a saw-tooth generator 40 which, on operation of a push-button switch 42, generates a rapidly increasing and then slowly linearly falling saw-tooth voltage 48 with which the heating current $I_H$ is correspondingly controlled. In addition the heating voltage control circuit 34 contains a circuit arrangement 44 which monitors the alteration in the Wehnelt voltage $U_W$ during the linear decrease in the voltage 48 and the heating current $I_H$ and stops the alteration in the heating current when the rate of alteration of the Wehnelt voltage increases.

The linearly falling part of the voltage 48 makes it possible to vary the heating current from a value $I_{H1}$ (FIG. 2) which is above the bend 46 in the characteristic curve 16, to a value $I_{H2}$, which is below the bend 46. When the heating voltage in the space charge part of the characteristic curve 16 is varied, a particular alteration in the heating current $\Delta_1 I_H$ corresponds to a relatively small change $\Delta U_{W1}$ in the Wehnelt voltage. In the saturation region, on the other hand, the characteristic curve 16 is considerably steeper and a variation in the heating current $\Delta_2 I_H$ of the same amount as $\Delta_1 I_H$ produces a relatively large change in the Wehnelt voltage $\Delta U_{W2}$. On the basis of this fact it is possible to determine the bend 46 and thereby the optimum heating current.

The saw-tooth generator 40 contains a condenser 50 which is charged with a voltage $U_{B1}$ via normally open contact 52a of a relay 52 and a resistance 54. The resistance 54 and voltage $U_{B1}$ are chosen so that the beginning part of the charging voltage curve is sufficiently linear.

A series arrangement of a normally open contact 56a of a relay 56 and a discharge resistor 58 are connected across the condenser 50. The relays 52 and 56 have coils 52w and 56w which are connected in series with each other and with the push-button switch 42 across an operating voltage source $U_{B2}$. The coil 56w of the relay 56 and the push-button switch 42 can be bridged by a holding circuit for the relay 52 which contains a second normally open contact 52b of the relay 52 and a normally closed contact 60a of a relay 60 connected in series with it.

The terminal which is not grounded of the condenser 50 is connected to the control electrode of an insulated gate field effect transistor 62 (IGFET) of very high input resistance, the channel of which is connected in series with a load resistance 64 to an operating voltage source $U_{B3}$. The connection between the resistance 64 and the channel of the field effect transistor 62 is coupled to the input of an amplifier 66 the output of which is connected to a control winding of the transductor 32 via the lead 36.

The lead 38 which conducts the A.C. voltage proportional to the Wehnelt voltage is connected to a rectifier circuit 68 to the output of which a differentiating circuit 70 consisting of a series condenser 72 and a parallel resistance 74 is connected. The input of a threshold circuit 76, the output of which is connected to a driving coil 60w of the relay 60, is connected to the differentiating circuit 70.

An adjustable resistor 80 is coupled between the condenser 50 and ground. The junction between the resistor 80 and the condenser 50 is coupled through a further resistor 82 to a potential source $U_{B4}$. The junction between the resistors 80 and 82 is coupled through a third normally open contact 52c of relay 52 to ground.

The circuit arrangement described above operates as follows:

Actuation of the push-button switch 42 exites the relays 52 and 56 the normally open contact 56a closes so that the condenser 50 is discharged. Afer a small delay the normally open contact 52a in the charging circuit of the condenser 50 and the normally open contact 52b in the holding circuit of the relay 52 bridging the coil 56w of the relay 56 both close so that the latter is de-energized even if the switch 42 is not released at once. Normally open contact 52c also closes and short-circuits resistor 80.

The condenser 50 now begins to charge. The current in the channel of the field effect transistor 62 begins to decrease from a high initial value and therefore the voltage at the input of the amplifier 66 then increases linearly. At the output of the inverting amplifier 66 a linearly decreasing control current for the transducer 32 is produced which lowers the A.C. voltage supplied to the heating voltage supply 20 so that the heating current is correspondingly reduced.

The reduction of the heating current is accompanied by a corresponding reduction in the (negative) Wehnelt voltage $U_W$ according to the characteristic curve 16. The correspondingly altered A.C. voltage on the lead 38 is rectified by the rectifier circuit 68 and differentiated by the differentiating circuit 70. So long as the differential change of the Wehnelt voltage is relatively small ($\Delta U_{W1}$ in FIG. 2) the voltage at the output of the differentiating circuit 70 is also relatively small, so that the threshold circuit 76 does not respond. When the bend 46 in the characteristic curve is reached, the Wehnelt voltage begins to change rapidly as a function of the constant variation of the heating current, the output voltage of the differentiating circuit 70 increases correspondingly so that the threshold circuit 76 responds and relay 60 is actuated. The normally closed contact 60a opens, the relay 52 is de-energized and opens the normally open contact 52a. This results in the charging circuit for the condenser 50 being interrupted at a voltage which corresponds to the heating current $I_H^*$. Simultaneously, also contact 52c opens so that resistor 80 is connected in the current path between $U_{B4}$ and ground. Resistors 80 and 82 form a voltage divider which is chosen such that a small voltage drop of proper polarity appears across the resistor 80 and, thus, in series with the voltage established across the condenser 50 that an increased voltage appears at the gate of IGFET 62, and the heating current is increased from the value $I_H^*$ at the bend to a desired optimum value near the low current end of the essentially linear portion R of the characteristic curve shown in FIG. 2. The desired value is generally a few percent higher than $I_H^*$ and may be e.g. at $I_{op}$.

If a highgrade condenser with a very low leakage current and insulating gate field effect transistor 62 with very high input resistance are used, the voltage on the condenser 50 remains practically unaltered for hours so that the optimum heating current value $I_{op}$ is stored and remains set.

When the push button switch 42 is operated again the condenser 50 is again discharged, whereupon the heating current increases and then decreases linearly as described until a new optimum heating current value is reached which takes account of the alterations to the cathode which may have taken place after the previous setting of the heating current.

Alternatively to a manual operation, the switch may be actuated automatically by a timer which in turn may respond to the time of operation of the cathode.

While a preferred embodiment of the invention has been shown and disclosed, it is to be understood, that the invention has been described by way of illustration rather than limitation and accordingly it is to be limited only by the appended claims taken in view of the prior art.

We claim:

1. In an electron beam machine with an electron gun including a cathode, a Wehnelt electrode, and a beam current, a method for setting a cathode heating current comprising the steps of:
 stabilizing the beam current by Wehnelt voltage control; and
 setting the cathode heating current on the basis of the dependence of the Wehnelt voltage to the heating current while the beam current is stabilized.

2. The method according to claim 1 and further comprising the steps of:
 generating a heating current/Wehnelt voltage characteristic curve;
 determining a region in the characteristic curve where the curve has a bend; and
 setting said cathode heating current at a value in the region of the bend in the characteristic curve.

3. The method according to claim 2 and further comprising the step of setting the cathode heating current at a value somewhat above the bend in the characteristic curve.

4. The method according to claim 2 or 3 and further comprising the steps of determining the characteristic curve and setting the cathode heating current during normal operation of the machine.

5. The method according to claim 1 and further comprising the step of repeating the cathode heating current setting step at intervals.

6. An electron beam machine with a beam current and an electron gun containing a heated cathode, a Wehnelt electrode responsive to a Wehnelt voltage to control the beam current and at least one anode, and a beam regulator acting on the Wehnelt voltage, comprising:

(a) first means (32, 40) to vary a cathode heating current ($I_H$) supplied to said heated cathode;

(b) a second means (44) to determine changes of the Wehnelt voltage ($U_W$) which are necessary in order to keep the beam current constant; and (c) third means (70, 76) which responds to a rate comprising the change of the Wehnelt voltage to the variation of cathode heating current to terminate the variation of the heating current at a predetermined value of said ratio and maintain said heating current at a constant level.

7. An electron beam machine according to claim 6 wherein said first means contains a saw-tooth generator (40) and further comprising means (32) controlled by said saw-tooth generator (40) to alter the heating power supplied to the cathode (10).

8. An electron beam machine according to claim 6 and further comprising:

a beam current regulator (28); and means for supplying an A.C. output signal from the beam current regulator (28) to said second means.

9. An electron beam machine as in claim 6 and further comprising means for establishing a heating current value at a bend of the heating current/Wehnelt voltage characteristic curve and means to set and maintain the heating current at a second value which is a predetermined amount greater than said first value.

10. An electron beam machine according to claim 6 wherein said third means contain a differentiator circuit (70) and a threshold circuit (76).

11. An electron beam machine according to claim 10 wherein said differentiator circuit establishes the magnitude of the change of the Wehnelt voltage for a given amount of change of the heating current and said threshold circuit is responsive to a predetermined value of said amount of change of Wehnelt voltage per given amount of variation of heating current.

* * * * *